United States Patent [19]

Shaheen et al.

[11] Patent Number: 4,991,285

[45] Date of Patent: Feb. 12, 1991

[54] METHOD OF FABRICATING MULTI-LAYER BOARD

[75] Inventors: Joseph M. Shaheen, La Habra; John Simone, Anaheim, both of Calif.

[73] Assignee: Rockwell International Corporation, El Segundo, Calif.

[21] Appl. No.: 437,879

[22] Filed: Nov. 17, 1989

[51] Int. Cl.⁵ .............................................. H05K 3/36
[52] U.S. Cl. ........................................ 29/830; 29/845;
174/52.2; 357/80; 361/412; 427/96
[58] Field of Search ................. 29/830, 832, 833, 834, 29/840, 845; 174/52.2, 267; 361/412, 413; 427/96; 357/80

[56] References Cited

U.S. PATENT DOCUMENTS

| | | | |
|---|---|---|---|
| 3,022,480 | 2/1962 | Tiffany | 174/267 X |
| 3,835,531 | 9/1974 | Luttmer | 29/830 X |
| 3,959,874 | 6/1976 | Coucoulas | 174/52.2 X |
| 4,076,575 | 2/1978 | Chang . | |
| 4,398,993 | 8/1983 | Hume, Jr. et al. . | |
| 4,472,238 | 9/1984 | Johnson . | |
| 4,501,638 | 2/1985 | Johnson . | |
| 4,517,050 | 5/1985 | Johnson et al. . | |
| 4,521,262 | 6/1985 | Pellegrino . | |
| 4,606,787 | 8/1986 | Pelligrino . | |
| 4,642,160 | 2/1987 | Burgess . | |
| 4,642,162 | 2/1987 | Brownell et al. . | |
| 4,663,497 | 5/1987 | Reimann . | |
| 4,670,091 | 6/1987 | Thomas et al. . | |
| 4,724,040 | 2/1988 | Iwasa . | |
| 4,734,156 | 3/1988 | Iwasa . | |
| 4,740,414 | 4/1988 | Shaheen . | |
| 4,747,908 | 5/1988 | Potter . | |
| 4,788,767 | 12/1988 | Desai et al. | 29/830 |
| 4,806,200 | 2/1989 | Larson et al. . | |
| 4,813,128 | 3/1989 | Massopust | 29/830 |
| 4,825,539 | 5/1989 | Nagashima et al. | 29/830 X |

FOREIGN PATENT DOCUMENTS 2734461 2/1979 Fed. Rep. of Germany ........ 29/845

Primary Examiner—Carl E. Hall
Assistant Examiner—Carl J. Arbes
Attorney, Agent, or Firm—H. Fredrick Hamann; George A. Montanye; Tom Streter

[57] ABSTRACT

A multi-layer board is fabricated by plating up conductive posts on a nonconductive layer. The tops of the posts are planarized, resulting in sharp corners. The posts are aligned with a template, which has a hole above each post, and a second nonconductive layer is placed between the top of the posts and the bottom of the template. The two layers are laminated together by compressing the second layer between the first layer and the template, and the posts punch through the second layer. Conductive traces may then be etched or deposited between the posts tops, and the process may be repeated as many times as desired.

12 Claims, 4 Drawing Sheets

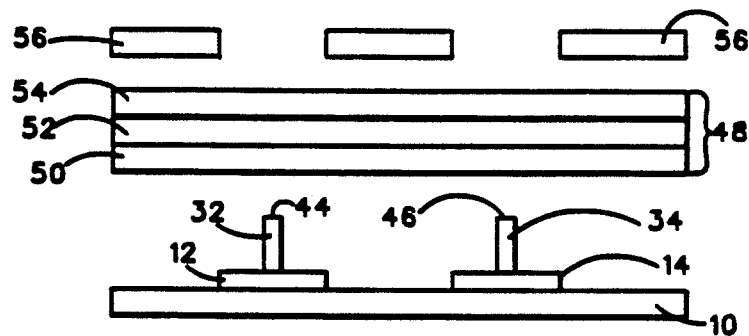
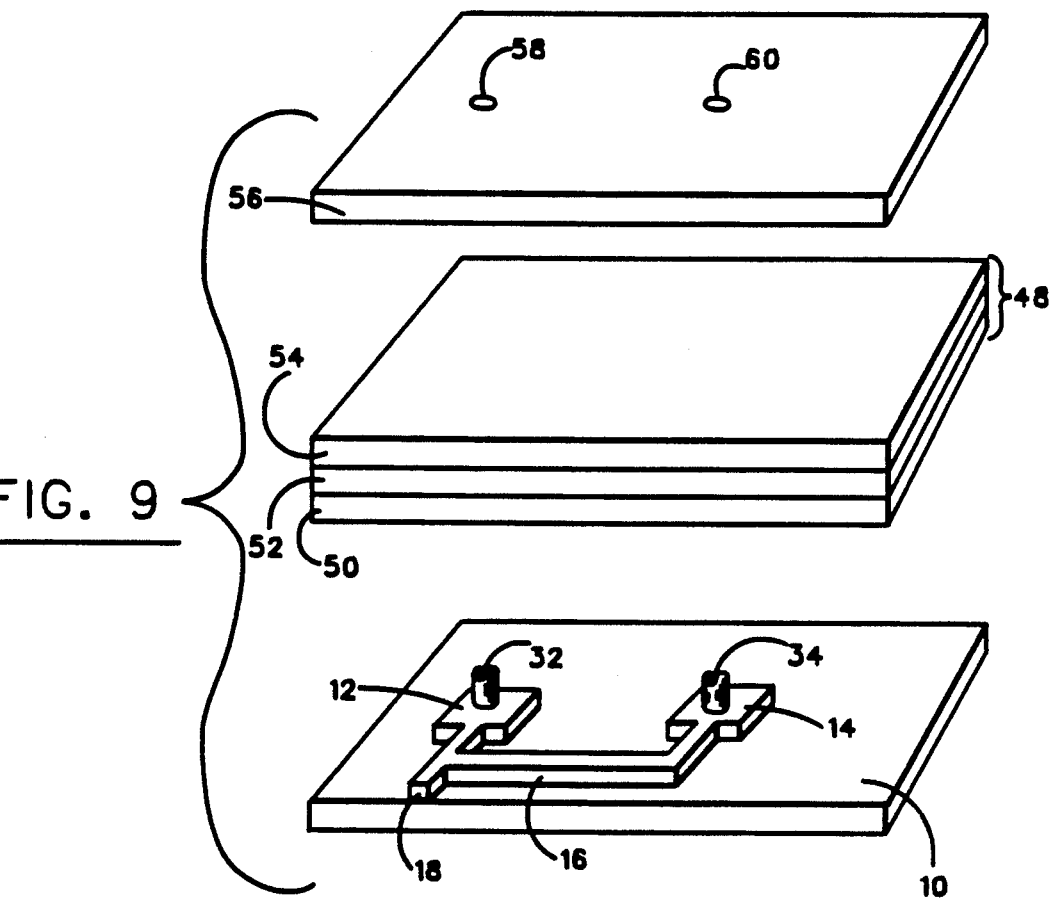

METHOD OF FABRICATING MULTI-LAYER BOARD

BACKGROUND OF THE INVENTION

This invention relates to multi-layer boards for interconnecting electronic components, and has particular relation to the fabrication of such boards without any drilling thereof.

When computers were first developed, insulated wires ran from the appropriate electrode of each component to the appropriate electrode(s) of the appropriate other component(s). This was bulky, slow, and expensive, but it had the advantage that wires could cross over one another without passing electricity from either wire to the other.

When printed circuit boards came into use, the wire could be screened or etched into the board, compactly, quickly, and cheaply. However, wires which crossed each other would pass electricity to each other, unless a layer of insulation was laid down on top of the lower wire before the upper wire was screened or etched on. This was slow and expensive.

Thus was born the multi-layer board (MLB). A plurality of thin boards are screened or etched with a variety of wires. The thin boards are then aligned, and are glued or otherwise bonded together into a thick multi-layer board (MLB). If a wire on any thin board (layer) needs to connect with a wire on any other layer (even an adjoining layer), a hole is drilled through the entire MLB and the hole is filled with a conductor. (Of course, the wires on all the other layers have to avoid where this hole is going to be.) Electronic components can then be attached to the wires on the top layer.

The need for the wires of all other layers to avoid the location where two layers are to be connected wastes a lot of space on these other layers. Moreover, each MLB has to be separately drilled.

SUMMARY OF THE INVENTION

The present invention eliminates most of this waste and drilling. The bottom layer has its wires screened or etched onto its surface, and the surface is covered with photoresist. In the places (pads) where a connection needs to be made to the next higher layer, a hole is formed in the photoresist. Note that this is done optically; no drilling is required. The layer is then placed in a copper solution, and copper is plated into the hole and onto the pad. A post of copper is thus formed.

The photoresist and copper is then planarized. This gives the upper surface of the post a sharp edge, the need for which will soon be apparent. The photoresist is then removed chemically, leaving a forest of posts-on-pads rising from the layer's surface.

At this time, the next higher layer—without wires having been screened or etched onto it yet—is laid on top of the post-on-pad forest, and is pressed down on the forest by a template. The template is made of brass, and has a hole over each post-on-pad. The upper layer is made of an organic material and is both weaker than a copper post is strong, and thinner than a copper post is high. Each copper post with its sharp upper edge accordingly punches a hole through the upper layer and enters the hole on the template. The post in not forced downward into the lower layer because the surface supporting the lower layer does not have any holes in it, and because the pad screened or etched onto the lower layer gives the post additional support.

At this point wires and pads are screened or etched onto the upper layer, with a pad being screened or etched onto the top of each post. The entire process is then repeated, as many times as desired, and electronic components are finally placed on the top layer.

If a connection needs to be made between pads on two nonadjoining layers, each intermediate layer has a pad screened or etched in the same location, to form a tower of posts-and-pads. Any such intermediate pad may or may not be attached to a wire on that layer, as the needs of the circuit may require. If a new tower (whether of single or multiple layers) needs to be started, it can be started at any location on any layer. On layers outside the top and bottom pads, the corresponding location is available for a wire or pad which is insulated from the tower.

The template needs to have holes drilled in it only once, preferably by a laser, and may be reused indefinitely. Each layer has its own template.

BRIEF DESCRIPTION OF THE DRAWINGS

FIG.8 shows the apparatus of FIG. 7, with a second board about to be compressed against it by a template.

FIG. 9 is an exploded view of the apparatus of FIG. 8.

DETAILED DESCRIPTION OF THE DRAWINGS

Figure 1:
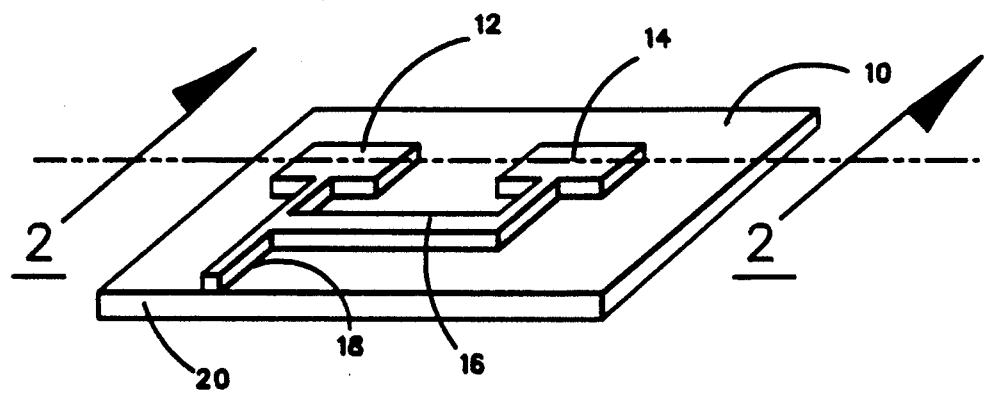
FIG. 1 is a perspective view of an organic board with pads and traces deposited thereon.

Turning now to FIG. 1, an organic board 10 is shown in perspective view. The board 10 supports a pair of conductive pads 12 and 14, with a conductive trace 16 connecting the pads 12 and 14. An access trace 18 leads from an edge 20 of the board 10 to the trace 16, so that electricity may be supplied to the pads 12 and 14 for plating up posts, as is described below. As an alternative to the access trace 18, the entire exposed surface of the board 10, pads 12 and 14, and trace 16 may be covered with an electroless layer of copper. In any event, the pads 12 and 14 must be made electrically accessible from some edge 20 of the board 10 during the fabrication of the present invention.

While only a single pair of pads 12 and 16, and only a single trace 16, have been shown, the invention is well suited for a large multiplicity of pads and traces.

Figure 2:
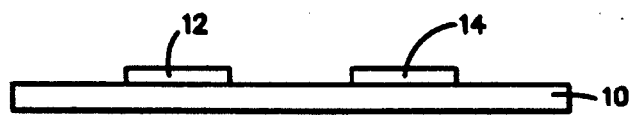
FIG. 2 is a vertical central cross section of the board and pads, taken along line 2—2 of FIG. 1.

FIG. 2 is a vertical central cross section of the board 10 and pads 12 and 14, taken along the line 2—2 of FIG. 1. This line does not pass through the traces 16 or 18, so as to allow a clearer description of a process embodied in the present invention.

Figure 3:
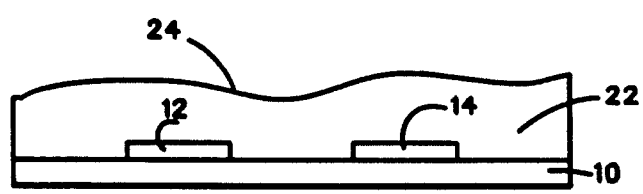
FIG. 3 shows a layer of photoresist deposited over the apparatus of FIG. 2.

Turning now to FIG. 3, a layer of photoresist 22 is deposited on the apparatus shown in FIG. 2. It is not necessary that the upper surface 24 of the photoresist 22 be extremely planar, and FIG. 3 shows a slight texture to the surface 24. If desired, a predrilled film mask (such as adhesive coated polyetherimide film) may be substituted for the layer of photoresist 22. The thickness of the mask or photoresist 22 is determined by the height of post 32 required, as is shown in FIG. 5.

Figure 4:
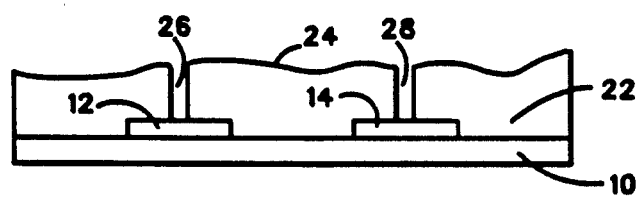
FIG. 4 shows a narrow hole optically formed through the photoresist, centered over each pad of FIG. 3.

As shown in FIG. 4, holes 26 and 28 are formed in the photoresist 22 using any convenient optical technique. If a predrilled film mask is substituted for the layer of photoresist 22, then this step may, of course, be omitted. Hole 26 is centered over pad 12, and is considerable narrower than pad 12; and hole 28 is centered over pad 14, and is considerable narrower than pad 14.

Figure 5:
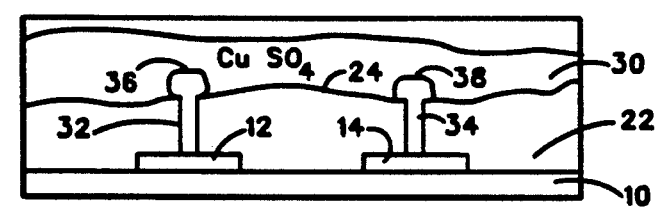
FIG. 5 shows plated up posts on the pads of FIG. 4, formed by electroplating copper from copper sulfate through the holes in the photoresist.

As is shown in FIG. 5, the apparatus of FIG. 4 is then immersed in a copper sulfate solution 30. Electricity is introduced through the access trace 18 (or, if the electroless copper surface alternative has been selected, through the electroless copper surface), and passes into the copper sulfate 30 only through holes 26 and 28, since the mask or photoresist 22 is non-conductive. The hole 26 therefore fills with a copper post 32 which is electrodeposited on the pad 12; and the hole 28 therefore fills with a copper post 34 which is electrodeposited on the pad 14.

Due to the uneven nature of the surface 24 of the mask or photoresist 22, the electrodeposition process may continue even after a post 32 or 34 has emerged from the mask or photoresist 22. In this case a mushromm head 36 will form on post 32, and a mushroom head 38 will form on post 34, but this is of little importance.

Figure 6:
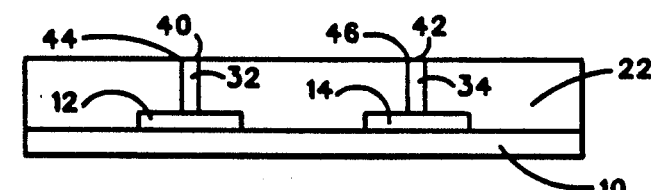
FIG. 6 shows the apparatus of FIG. 5 after its top surface has been planerized.

FIG. 6 shows the reason for this importance of the mushroom heads 36 and 38: planarization. This step may be taken by any convenient means, and is important for two reasons.

Figure 10:
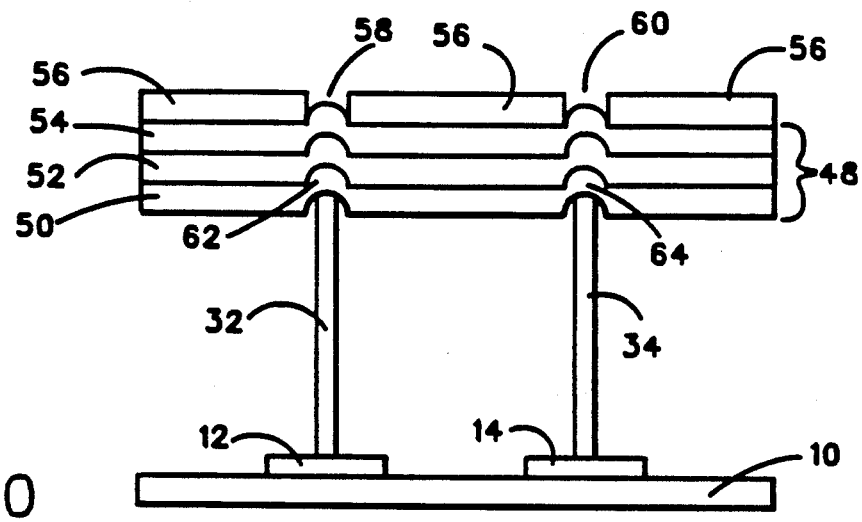
FIG. 10 shows the apparatus of FIG. 8 during the compression process.

The first reason why planarization is important is that the posts 32 and 34 will be pressed through a second board 48, as is shown in FIGS. 8, 9, and 10. The only way they will be able to cut through the second board 48 will be if their respective upper surface 40 and 42 have sharp edges 44 and 46. A planer upper surface 40 or 42 will assure such sharp edges 44 and 46.

The second reason why planarization is important is that the second board 48 will have a substantially uniform thickness. The mushroom heads 36 and 38 are removed, and the upper portions of the copper posts 32 and 34 are planarized, by grinding them flat to the surface of the mask or photoresist layer 22, thus maintaining uniform height. If the posts 32 and 34 have respective upper surfaces 40 and 42 which are substantially uniform distance above the pads 12 and 14, then they will penetrate to a substantially uniform height above the second board 48. This will facilitate their interconnection with pads which will be deposited on the upper surface of the second board 48.

Figure 7:
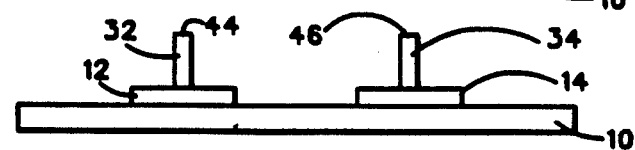
FIG. 7 shows the apparatus of FIG. 6 after the photoresist has been removed.

As shown in FIG. 7, the mask or photoresist 22 may be removed once the posts 32 and 34, with their sharp edges 44 and 46, have been formed. If the electroless copper surface method was used to supply the electricity to the pads 12 and 14 which was needed for the electrodeposition of the posts 32 and 34, then the electroless copper surface should also be removed at this time. Otherwise, traces and pads which should not be in electrical connection with each other will be.

Turning now to FIGS. 8 and 9, the second board 48 may now be compressed onto the board 10. This second board 48 (which becomes a circuit board layer) is made up of a sheet 50 of resin impregnated glass cloth (prepreg), either epoxy-glass, polyimide glass, or other adhesive coated dielectric films (such as teflon, etc.), and a layer 52 of ⅛ oz. copper carried on a 0.003 inch aluminum carrier 54; that is, the copper 52 is sandwiched between the aluminum 54 and the prepreg 50.

A template 56, preferably made of brass, is used to accomplish this compression. The template 56 is shown with both boards 10 and 48 in FIGS. 8 (cross section) and 9 (perspective). The template 56 is placed over the board 48 with the aluminum side 54 up.

A hole 58 is formed in the template 56 above the post 32, and a hole 60 is formed in the template 56 above the post 54. The diameters of the holes 58 and 60 are somewhat larger than the diameters of the posts 32 and 34, so as to accommodate, during the compression/lamination process, not only the posts 32 and 34, but also the portions of the second board 48 lying between the post 32 and the holes 58, and between the post 34 and the hole 60.

Figure 11:
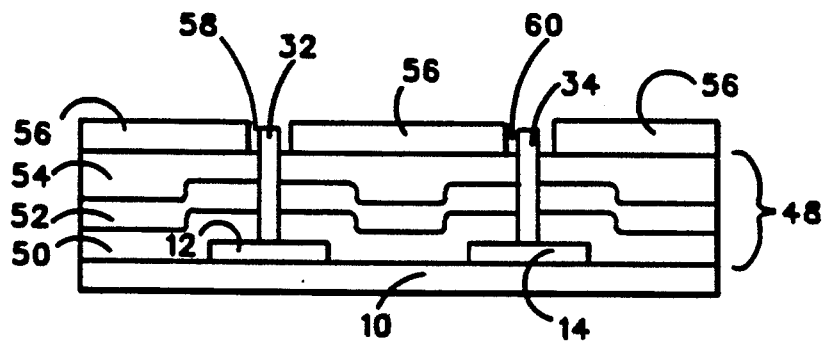
FIG. 11 shows the apparatus of FIG. 10 after compression has been completed.

FIG. 10 shows the begining of the process of compression or lamination. Portions 62 and 64 of the second board 48, respectively lying above posts 32 and 34, are first bent as the template 56 presses the second board 48 down. Then, as shown in FIG. 11, as the pressure contiues and increases, the portions 62 and 64 rupture, allowing the posts 32 and 34 to penetrate the board 48 and the holes 58 and 60. At the same time, the adhesive prepreg layer 50 of the second board 48 is pressed against the first board 10 and bonds the two board together.

Figure 12:
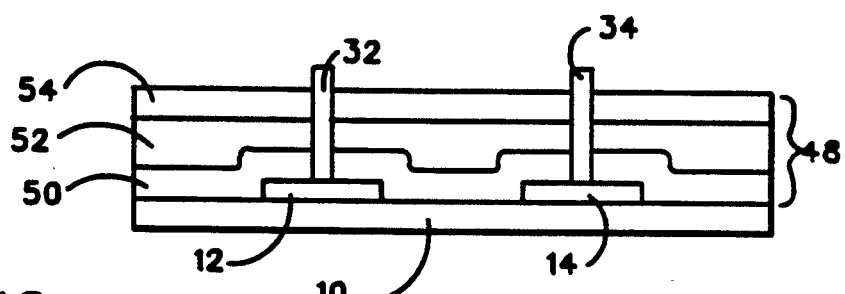
FIG. 12 shows the apparatus of FIG. 11 after the template has been removed.
Figure 13:
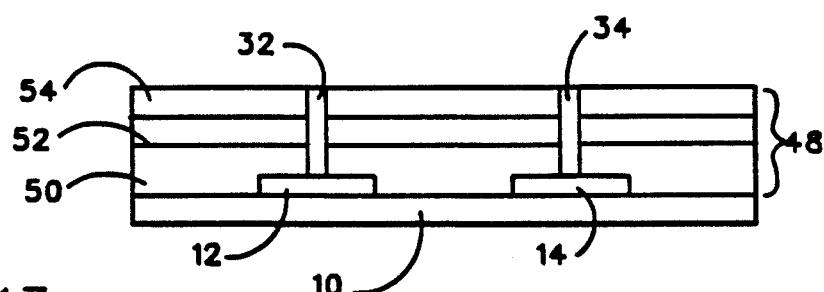
FIG. 13 shows the apparatus of FIG. 12 after the posts have been ground down to the aluminum layer of the second board.
Figure 14:
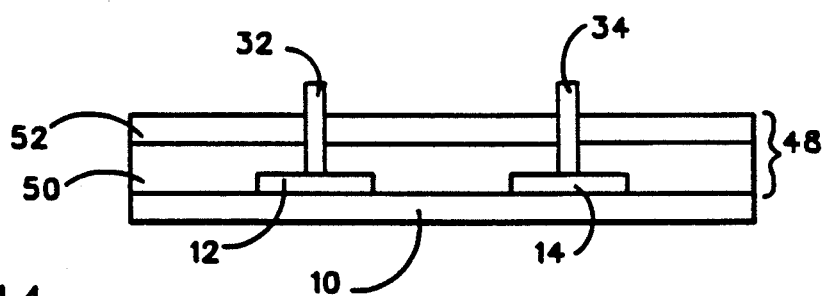
FIG. 14 shows the apparatus of FIG. 13 after the aluminum layer has been peeled off.
Figure 15:
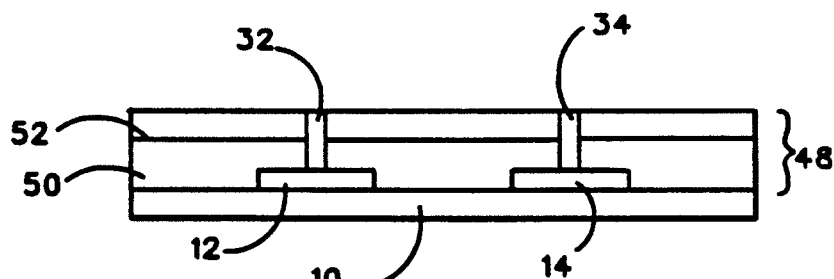
FIG. 15 shows the apparatus of FIG. 14 after the posts have been ground down to the copper layer of the second board.
Figure 16:
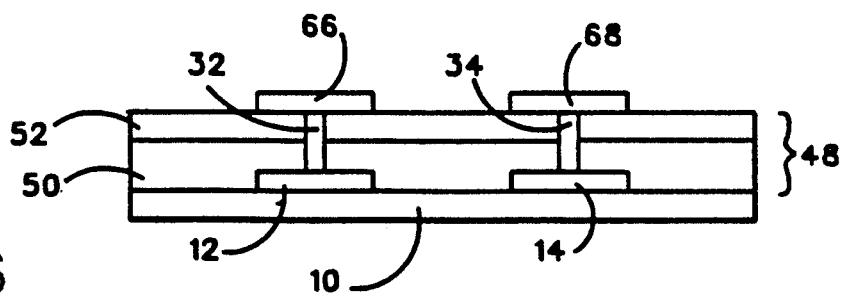
FIG. 16 shows the apparatus of FIG. 15 after pads have been deposited on the copper layer over the posts protruding from the first board.

The template 56 may be removed (FIG. 12). The posts 32 and 34 are ground to the upper surface of the aluminum carrier 54 (FIG. 13). The aluminum carrier 54 is then removed by peeling it away, exposing the copper layer 52 (FIG. 14). The posts 32 and 34 are then ground down to the upper surface of the copper layer 52 (FIG. 15). Additional pads 66 and 68 may now be deposited on the second board 48 (FIG. 16). The pads 66 and 68 assure a good electrical connection between the posts 32 and 34 and the copper layer 52. The board 48 is now in condition for etching traces in the copper layer 52, attaching electrical components, or other steps subsequent to, and forming no part of, the present invention.

It is apparent that this process may be repeatedly used to bond together, both electrically and mechanically, any number of boards, and that a post may lie directly above another post, when it is desired to electrically connect non-adjacent boards, or may be omitted, when such connection is not desired.

Industrial Applicability

The present invention is capable of exploitation in industry, and can be used, whenever a multi-layer board is desired. The only drilling required is that of the template for each layer, and only a single template needs to be drilled for each layer, regardless of how many multi-layer boards are to be fabricated. Separate drilling of each layer of each board is eliminated. The present invention can be made of any suitable materials, provided only that the conductive posts are made strong enough and sharp enough to punch through the insulating layers.

While several embodiment of the present invention have been described herein, the true spirit and scope of the present invention are not defined by this description, but only by the appended claims.

What is claimed is:

1. A method of fabricating a multi-layer board, comprising the steps of:
    fabricating a plurality of conductive posts on a first non-conductive layer;
    aligning a template over the posts, the template including a plurality of holes extending therethrough, such that each of the posts lies beneath a hole in the template;
    compressing a second non-conductive layer between the first non-conductive layer and the template with a force sufficient to drive the posts through the second non-conductive layer.

2. The method of claim 1,
    wherein the method further comprises the step of fabricating a plurality of conductive pads on the first non-conductive layer before the post fabricating step; and
    wherein each of the posts is fabricated on a pad.

3. The method of claim 2, further comprising the step of fabricating a conductive trace on the first non-conductive layer between selected ones of the conductive pads on the first non-conductive layer before the layer compressing step.

4. The method of claim 1,
    wherein the second non-conductive layer comprises a conductive surface adjacent the template, and
    wherein the layer compressing step comprises the step of compressing the conductive surface between the first non-conductive layer and the template with a force sufficient to drive the posts through the second non-conductive layer and the conductive surface.

5. The method of claim 4, further comprising the step of fabricating a conductive pad on each post on the conductive surface after the surface compressing step.

6. The method of claim 5, further comprising the step of fabricating a conductive trace from the conductive surface between selected ones of the conductive pads on the second non-conductive layer before the surface compressing step.

7. The method of claim 1, further comprising the step of planarizing the posts after the post fabricating step.

8. The method of claim 7,
    wherein the method further comprises the step of fabricating a plurality of conductive pads on the first non-conductive layer before the post fabricating step; and
    wherein each of the posts is fabricated on pad.

9. The method of claim 8, further comprising the step of fabricating a conductive trace on the first non-conductive layer between selected ones of the conductive pads on the first non-conductive layer before the layer compressing step.

10. The method of claim 7,
    wherein the second non-conductive layer comprises a conductive surface adjacent the template, and
    wherein the layer compressing step comprises the step of compressing the conductive surface between the first non-conductive layer and the template with a force sufficient to drive the posts through the second non-conductive layer and the conductive surface.

11. The method of claim 10, further comprising the step of fabricating a conductive pad on each post on the conductive surface after the surface compressing step.

12. The method of claim 11, further comprising the step of fabricating a conductive trace from the conductive surface between selected ones of the conductive pads on the second non-conductive layer before the surface compressing step.

* * * * *